United States Patent [19]
Ono et al.

[11] Patent Number: 5,377,596
[45] Date of Patent: Jan. 3, 1995

[54] MAGNETIC LEVITATING TRANSPORTATION APPARATUS WITH RAIL GAP SENSOR AND NON-PARALLEL MAGNET UNIT ARRANGEMENT

[75] Inventors: Yoshinobu Ono; Yoshio Watanabe; Shinjiro Tanida, all of Kawasaki, Japan

[73] Assignee: Fujitsu Limited, Kawasaki, Japan

[21] Appl. No.: 86,033

[22] Filed: Jul. 6, 1993

[30] Foreign Application Priority Data

Jul. 6, 1992 [JP] Japan .................................. 4-178636
Jun. 15, 1993 [JP] Japan .................................. 5-143660

[51] Int. Cl.⁶ ............................................. B60L 13/06
[52] U.S. Cl. ....................................................... 104/284
[58] Field of Search ................ 104/281, 282, 284, 286

[56] References Cited

U.S. PATENT DOCUMENTS 4,732,087  3/1988  Morishita et al. ............. 104/284 X
5,067,415 11/1991  Morishita et al. ............. 104/284 X

FOREIGN PATENT DOCUMENTS 18115  2/1978  Japan .................................. 104/284
  9807  1/1979  Japan .................................. 104/284
116908  6/1986  Japan .................................. 104/284
142905  6/1986  Japan .................................. 104/284
 31304  2/1987  Japan .................................. 104/284
 27704  2/1991  Japan .................................. 104/284

Primary Examiner—Robert J. Oberleitner
Assistant Examiner—S. Joseph Morano
Attorney, Agent, or Firm—Staas & Halsey

[57] ABSTRACT

A magnetic levitating transportation apparatus including rails and a vehicle capable of travelling along the rails by a linear motor and caused to magnetically levitate by magnet units with electro-magnets. The gap is controlled by controlling the current supplied to the magnet units in response to gap sensors. The rails include rail gaps where the ends of two rail elements abut, and rail gap sensors are arranged to detect the rail gap. Thus, current supplied to one of the magnet units is disabled when the rail gap is detected, and the current to be supplied to the associated magnet unit is stopped. The current to be supplied to the associated magnet unit is determined from the outputs of the remaining gap sensors.

21 Claims, 15 Drawing Sheets

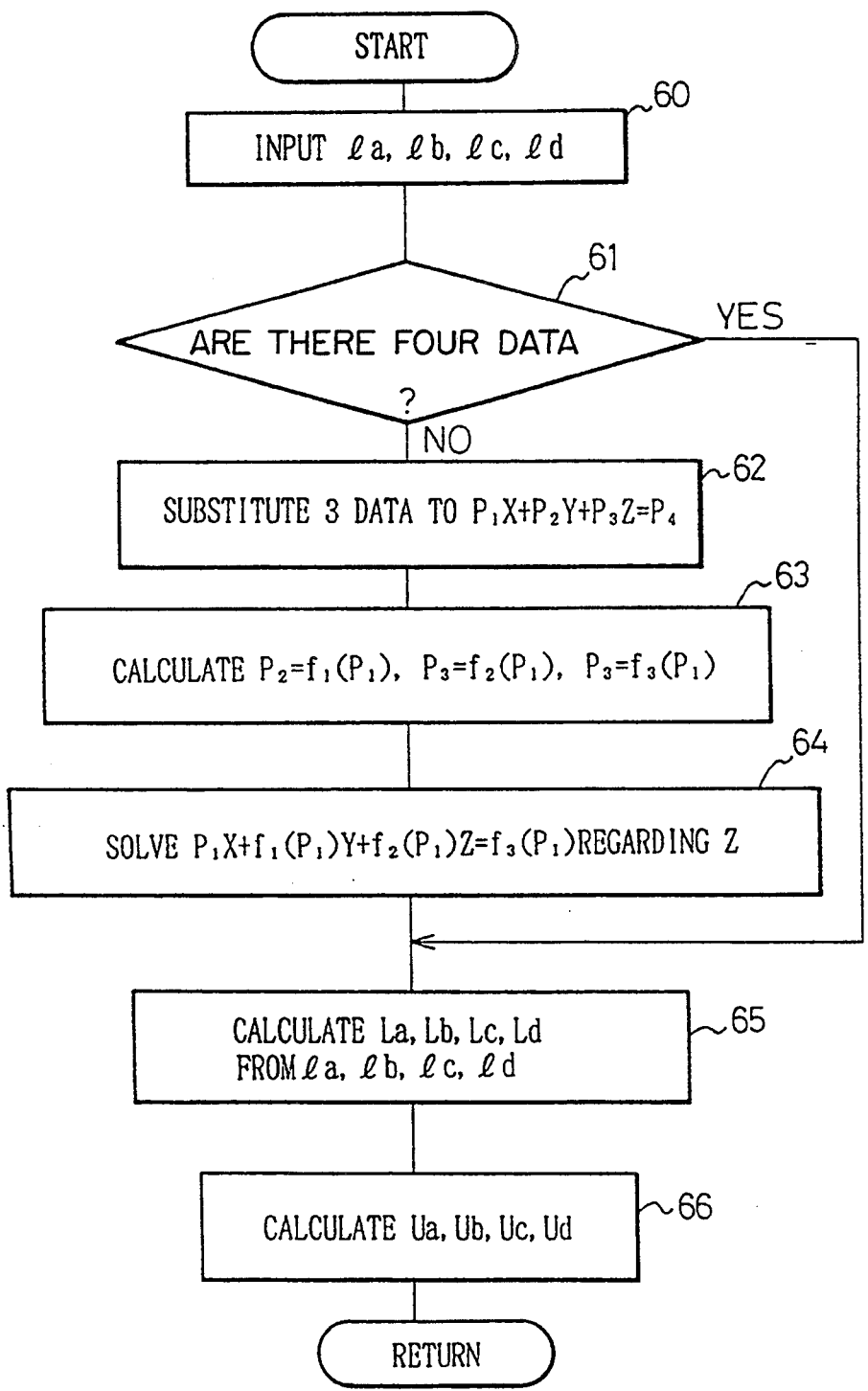

MAGNETIC LEVITATING TRANSPORTATION APPARATUS WITH RAIL GAP SENSOR AND NON-PARALLEL MAGNET UNIT ARRANGEMENT

BACKGROUND OF THE INVENTION

1. Field of the Invention

The present invention relates to a magnetic levitating transportation apparatus including a vehicle capable of travelling along a rail which comprises a plurality of rail elements arranged in an end-to-end abutment relationship, and in particular, the present invention relates to a magnetic levitating transportation apparatus including a vehicle capable of stably passing a rail gap where the ends of two rail elements abut.

2. Description of the Related Art

In recent semiconductor manufacturing industries, wafers are often automatically transported in wafer treatment processes so that wafers are contaminated by dust as little as possible. A magnetic levitating transportation apparatus such as a linear motor vehicle is suitable for an automatic transportation apparatus for wafers because there is no friction between the vehicle and the rail and thus dust is not generated. In addition, a magnetic levitating transportation apparatus makes it possible to transport wafers quickly and reliably.

The magnetic levitating transportation apparatus includes a vehicle capable of levitating relative to a rail installed along a predetermined path with a gap between the vehicle and the rail. The vehicle travels along the rail. The vehicle is driven along the rail by a linear motor and caused to magnetically levitate by magnet units which are arranged on the vehicle. Also, at least one gap sensor is arranged on the vehicle for detecting the gap between the vehicle and the rail to control the current supplied to the magnet units to maintain the gap between the vehicle and the rail at a desired constant value. For example, when four magnet units are arranged on the vehicle, one gap sensor is arranged at the center of each magnet unit so that the distance between the gap sensor and the vehicle coincides with the distance between each magnet unit and the vehicle.

Usually, the rail comprises a plurality of rail elements arranged in an end-to-end abutment relationship, and there is a rail gap between two rail elements. The rail gap is not physically connected by welding or a joint member; however, the ends of two rail elements are abutted against each other with the rail gap therebetween. Accordingly, the rail gap is a discontinuous portion of the rail.

In the prior art magnetic levitating transportation apparatus, there is a problem that when the gap sensor approaches a rail gap, the gap sensor outputs an output value higher than an actual flight gap between the magnet unit and the rail. Accordingly, a large current is supplied to the magnet unit associated with the gap sensor passing through the rail gap, resulting in a loss of position of the vehicle. Then, after the gap sensor passes through the rail gap, the current supplied to the magnet unit is abruptly restored to a normal value, and a vibration may occur in the position of the vehicle.

This problem can be solved by eliminating the rail gap, but in order to eliminate a rail gap, a further problem arises in that it is necessary to ensure precise machining accuracy of the rail and to prepare an additional adjusting rail to compensate for an error, and it is difficult to lay the rail in the factory and to connect the rail elements precisely. Also, if a large current is supplied to the magnet unit when the vehicle passes the rail gap, the battery power is consumed in a short time and the charging time is increased, so that the availability of the apparatus is reduced.

Further, the magnet unit for causing the vehicle to levitate is designed to have a width in correspondence with the width of the rail to effect a self-centering action relative to the rail. That is, when an external force is applied to the vehicle and the magnet unit is transversely displaced from the rail, the magnet unit automatically returns to just below the rail by the action of the magnetic attraction between the magnet unit and the rail, and the vehicle can travel exactly along the rail.

However, it is preferable that the magnet unit have a rectangular cross-sectional shape rather than a square cross-sectional shape. In this case, if the vehicle passes crossing rails with the vehicle directed in a constant direction, the self-centering action varies. That is, assuming a first case in which the vehicle travels along a first rail portion of the crossing rails with the long side of the magnet unit directed perpendicular to the first rail portion, and a second case in which the vehicle travels along a second rail portion of the crossing rails with the short side of the magnet unit directed perpendicular to the second rail portion, and if a self-centering action is fully ensured in the first case, a self-centering action in the second case is not as fully ensured because the width of the magnet unit in the second case does not correspond to the width of the rail. Also, if the magnet unit is constructed to have a square cross-sectional shape, the total size of the magnet unit, and the weight of the vehicle, increases.

SUMMARY OF THE INVENTION

The object of the present invention is to provide a magnetic levitating transportation apparatus in which a vehicle can stably travel when the vehicle passes a rail gap irrespective of the travelling direction of the vehicle.

According to the present invention, there is provided a magnetic levitating transportation apparatus comprising stationary rail means comprising a plurality of rail elements arranged in an end-to-end abutment relationship, a vehicle capable of travelling along the rail means, at least one magnet unit arranged on the vehicle for causing the vehicle to levitate relative to the rail means, a first detecting means for detecting a flight gap between the rail means and the vehicle, a second detecting means for detecting a rail gap between two rail elements, and control means for controlling the current supplied to the magnet unit in response to the output of said first detecting means, to disable the output of the first detecting means when said second detecting means detects a rail gap, and for enabling the output of the first detecting means when said second detecting means does not detect a rail gap.

With this arrangement, a current is supplied to the magnet unit in response to an output of said first detecting means, and the output of the first detecting means is disabled when a rail gap is detected. Accordingly, in the rail gap, the current supplied to the magnet unit is not increased in direct proportion to the output of the first detecting means, the posture of the vehicle is not lost, and the consumption of the battery power is reduced.

When the output of the first detecting means is disabled, i.e., when a rail gap is detected, it is possible to (a)

stop the supply of the current to the magnet unit responsive to that first detecting means or to (b) adjust the current supplied to the magnet unit from outputs of the remaining first detecting means other than that associated with the second detecting means detecting a rail gap.

It is preferable that the magnet unit is rotatable about the center, so that the vehicle can travel along crossing rails by rotating the magnet unit with the vehicle directed in a constant direction. In this case, an identical self-centering action is obtained when the vehicle travels on either of the crossing rails.

Preferably, at least one magnet unit comprises at least one electro-magnet and at least one permanent magnet, and in this case, these at least one electro-magnet and at least one permanent magnet comprise at least one central permanent magnet and two electro-magnets on either side of the electro-magnet, arranged in a U-shape.

Preferably, at least one magnet unit comprises four magnet units arranged on the vehicle so that four magnet units form a quadrilateral, and the first and second detecting means comprise four first and second detecting means arranged on or near the four magnet units, respectively.

In one of the preferable arrangement of this feature, the vehicle has a longitudinal and transverse center lines, and the quadrilateral formed by four magnet units has first and second pairs of opposite sides, opposite sides of each pair not being parallel to each other or symmetrical with respect to one of the longitudinal and transverse center lines.

In another preferable arrangement, the vehicle has longitudinal and transverse center lines, and the quadrilateral formed by four magnet units has a first pair of opposite sides extending parallel to the longitudinal center line of the vehicle and a second pair of opposite sides extending parallel to the transverse center line of the vehicle; and the longitudinal center line is parallel to the rail means, and the first pair of opposite sides of the quadrilateral formed by four magnet units comprises first and second opposite sides extending parallel to the longitudinal center line of the vehicle on either side of the longitudinal center line of the vehicle, two sets of first and second detecting means being located on the first side and in front of the associated magnet units when viewed in a predetermined travelling direction, further two sets of first and second detecting means being located on the second side and behind the associated magnet units when viewed in the predetermined travelling direction.

BRIEF DESCRIPTION OF THE DRAWINGS

The present invention will become more apparent from the following description of the preferred embodiments, with reference to the accompanying drawings, in which:

FIG. 22 is a flow chart of the control of the magnetic levitating transportation apparatus of FIG. 12.

DESCRIPTION OF THE PREFERRED EMBODIMENTS

Figure 1:
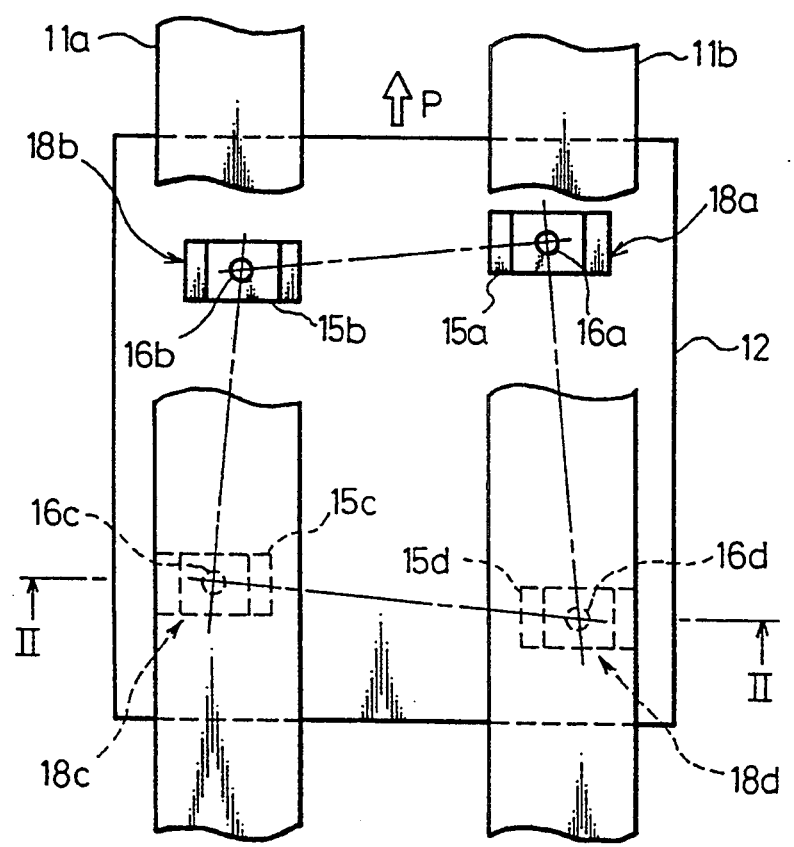
FIG. 1 is a plan view of a magnetic levitating transportation apparatus according to the first embodiment of the present invention.
Figure 2:
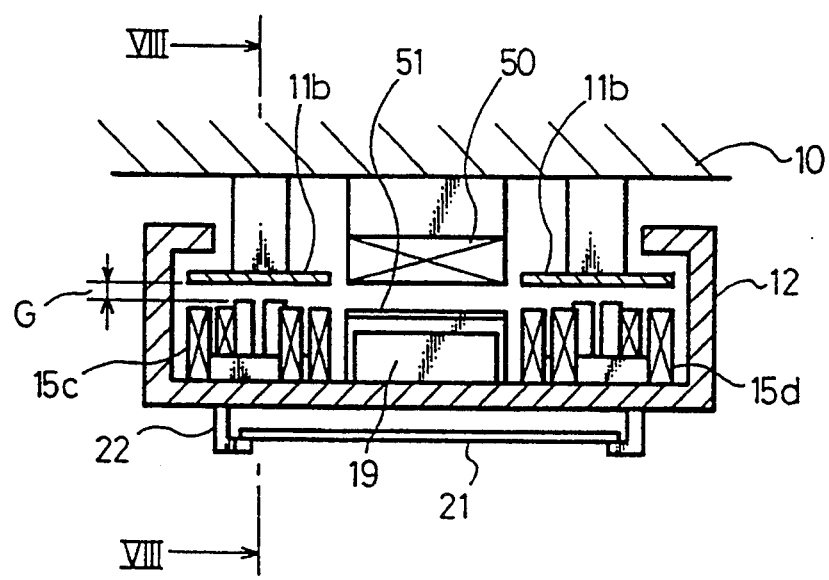
FIG. 2 is a cross-sectional view of the apparatus of FIG. 1, taken along the line II—II of FIG. 1.

FIGS. 1 to 10 show a magnetic levitating transportation apparatus according to the first embodiment of the present invention. As shown in FIGS. 1 and 2, the magnetic levitating transportation apparatus comprises two parallel rails 11a and 11b of a magnetic material suspended from a ceiling 10 (see FIG. 2), and a vehicle 12 capable of travelling along the rails 11a and 11b without contacting the rails 11a and 11b. As illustrated in FIG. 2, a linear motor is provided for driving the vehicle 12, the linear motor including a primary winding 50 suspended from the ceiling 10 between the rails 11a and 11b, and a secondary conductor plate 51 arranged at the center of the vehicle 12. Accordingly, the vehicle 12 can travel along the rails 11a and 11b.

Figure 3:
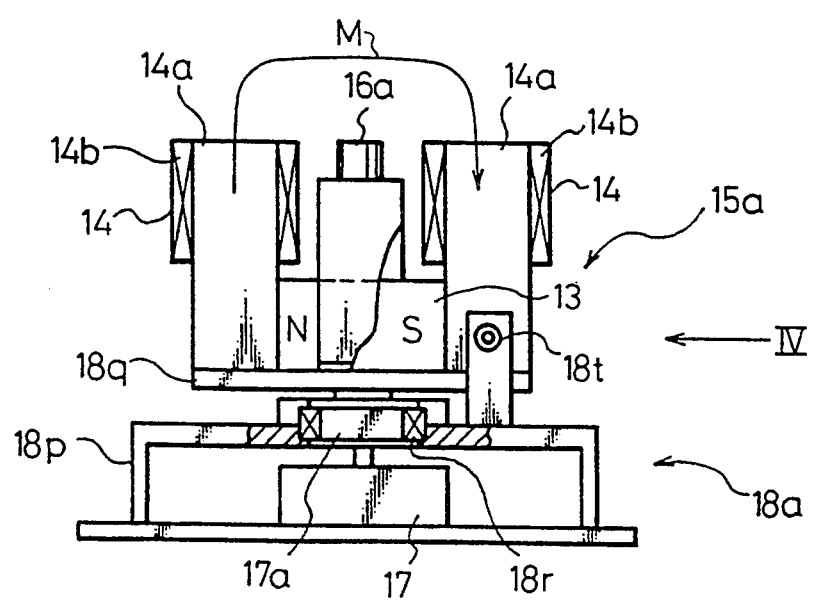
FIG. 3 is a detailed front view of the magnet unit with the gap sensor of FIGS. 1 and 2.

Four magnet units 15a to 15d are arranged on the vehicle 12 for causing the vehicle 12 to magnetically levitate relative to the rails 11a and 11b, so that the four magnet units 15a to 15d form a quadrilateral. As shown in FIG. 3, each of the magnet units 15a to 15d comprises a central permanent magnet 13 and two electro-magnets 14 on either side of the permanent magnet 13, arranged in a U-shape. Each electro-magnet 14 comprises an iron core 14a and a coil 14b wound around the iron core 14a, and generates a magnetic flux so as to penetrate the iron core 14a by supplying a current to the coil 14b. The permanent magnet 13 has a N-pole and a S-pole, and the line of magnetic force starting from the N-pole of the permanent magnet 13 passes through the left electro-magnet 14 in FIG. 3 and the right electro-magnet 14 to the S-pole of the permanent magnet 13, as shown by the arrow M in FIG. 3. As shown in FIG. 1, each of the magnet units 15a to 15d is arranged so that the direction of the magnetic flux generated by the magnet unit is perpendicular to the travelling direction of the vehicle 12. The travelling direction of the vehicle 12 is shown by the arrow P in FIG. 1.

Gap sensors 16a to 16d are arranged in association with the magnet units 15a to 15d, respectively. In the first embodiment, each of the gap sensors 16a to 16d is arranged at the center of each of the magnet units 15a to 15d. As shown in FIGS. 1 and 3, the gap sensors 16a to 16d and the magnet units 15a to 15d are rotatably constructed as units 18a to 18d, respectively.

Figure 4:
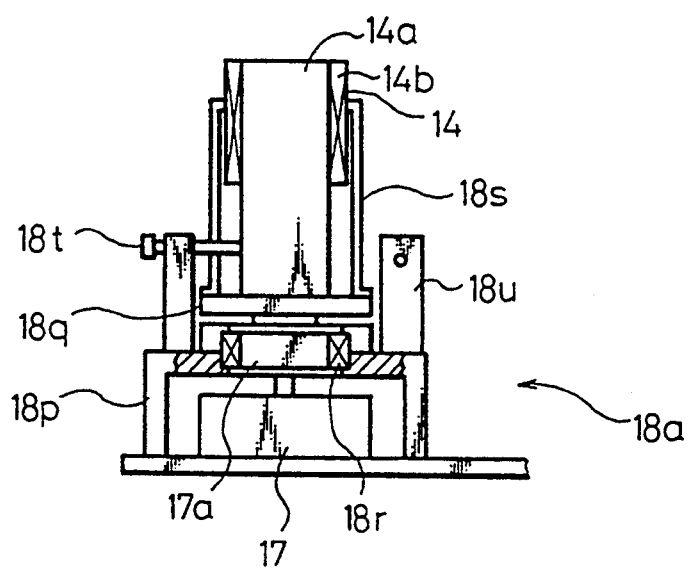
FIG. 4 is a side view of the magnet unit of FIG. 3, viewed from the arrow IV of FIG. 3.
Figure 5:
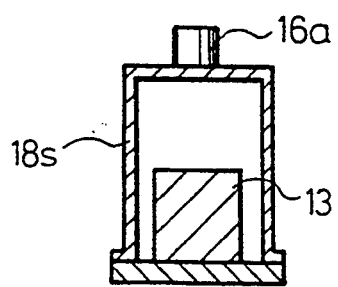
FIG. 5 is a cross-sectional view of a portion of FIG. 3 passing through the gap sensor.

As shown in FIG. 3, each unit 18a (other units 18b to 18d are not shown in FIG. 3 but have features identical to the unit 18a) comprises a unit base 18p fixed to the vehicle 12, a rotatable unit plate 18q, and a motor 17. The motor 17 is fixed to the vehicle 12 and has an output shaft to which a rotatable element 17a is fixed. The rotatable element 17a is supported by a bearing 18r mounted to the unit base 18p, and the unit plate 18q is supported by the rotatable element 17a, whereby the magnet unit 15a and the gap sensor 16a mounted to the unit plate 18q are caused to rotate by 90 degrees clockwise or anti-clockwise by the motor 17. Stoppers 18t are provided to stop the unit 18a at predetermined angular positions. As shown in FIGS. 3 to 5, the gap sensor 16a is secured to an inverted U-shaped stay 18s straddling the central permanent magnet 13 and fixed to the unit plate 18q.

Figure 6:
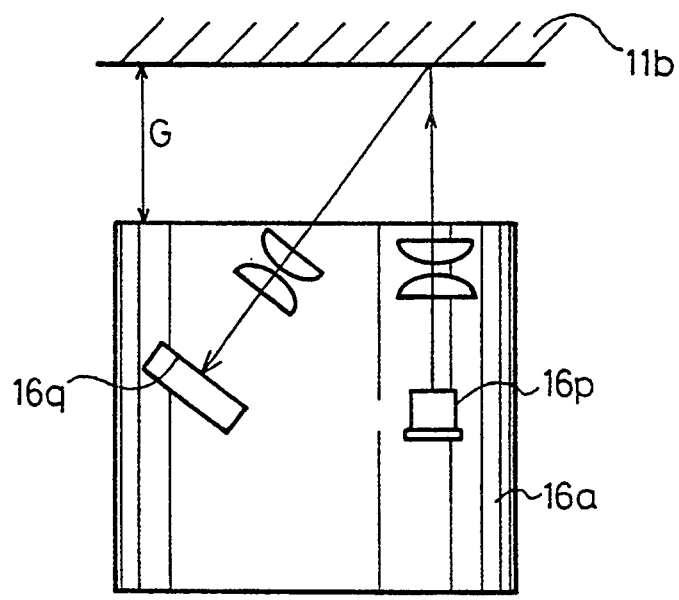
FIG. 6 is a diagrammatic view of an example of an optical type gap sensor.
Figure 7:
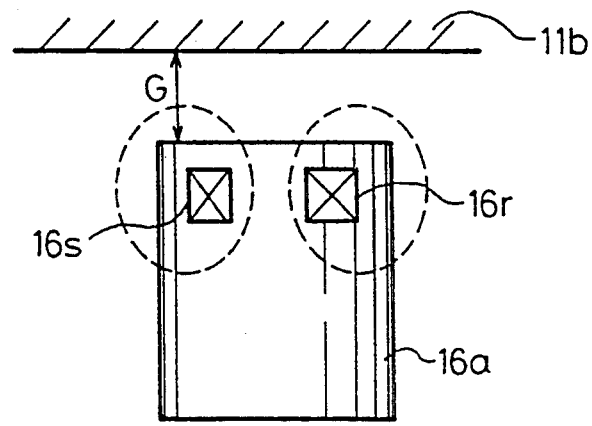
FIG. 7 is a diagrammatic view of an example of a magnetic type gap sensor.

It is possible to use several types of gap sensors 16a to 16d. For example, FIG. 6 shows an example of an optical type gap sensor 16a comprising a light emitter 16p and a light receiver 16q, in which a gap G between the gap sensors 16a and the rail 11b is detected by detecting a portion of the light which is emitted from the light emitter 16p and reflected at the rail 11b. FIG. 7 shows an example of a magnetic type gap sensor 16a comprising a high frequency emitting coil 16r and a high frequency detecting coil 16s, in which a flight gap G between the gap sensors 16a and the rail 11b is detected by detecting an eddy current. These gap sensors 16a to 16d are well known.

Figure 8:
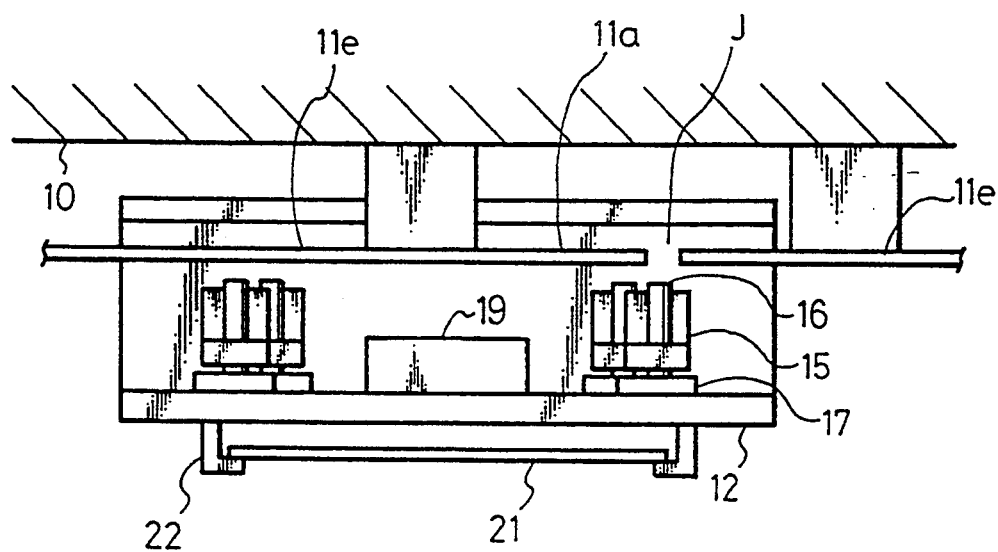
FIG. 8 is a cross-sectional view of the apparatus of FIGS. 1 and 2, taken along the line VIII—VIII of FIG. 2.
Figure 9:
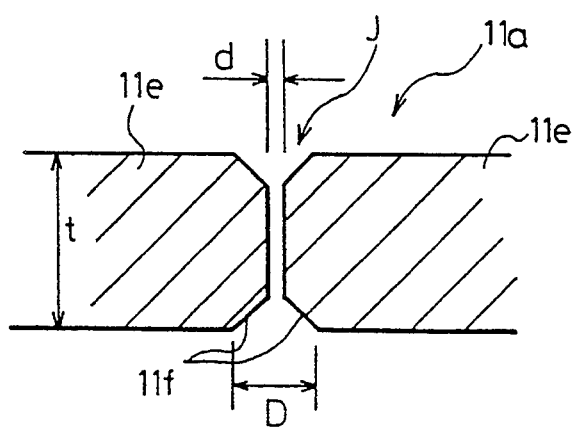
FIG. 9 is a view of a rail gap where the ends of two rail elements abut.

As shown in FIGS. 8 and 9, each rail 11a or 11b comprises a plurality of rail elements 11e having respective length and arranged one after another in an end-to-end abutment relationship, and a rail gap J exists where the ends of two rail elements 11e abut, the rail gap J being a discontinuous portion of the rail 11a or 11b. In the embodiment, there are chamferings 11f at the ends of the rail elements 11e, and the thickness of the rail elements 11e is, for example, 5.0 millimeters. The gap D between the chamferings 11f is, for example, 1 millimeter and the gap d between the facing ends of the rail elements 11e is, for example, 0.2 millimeters.

Figure 10:
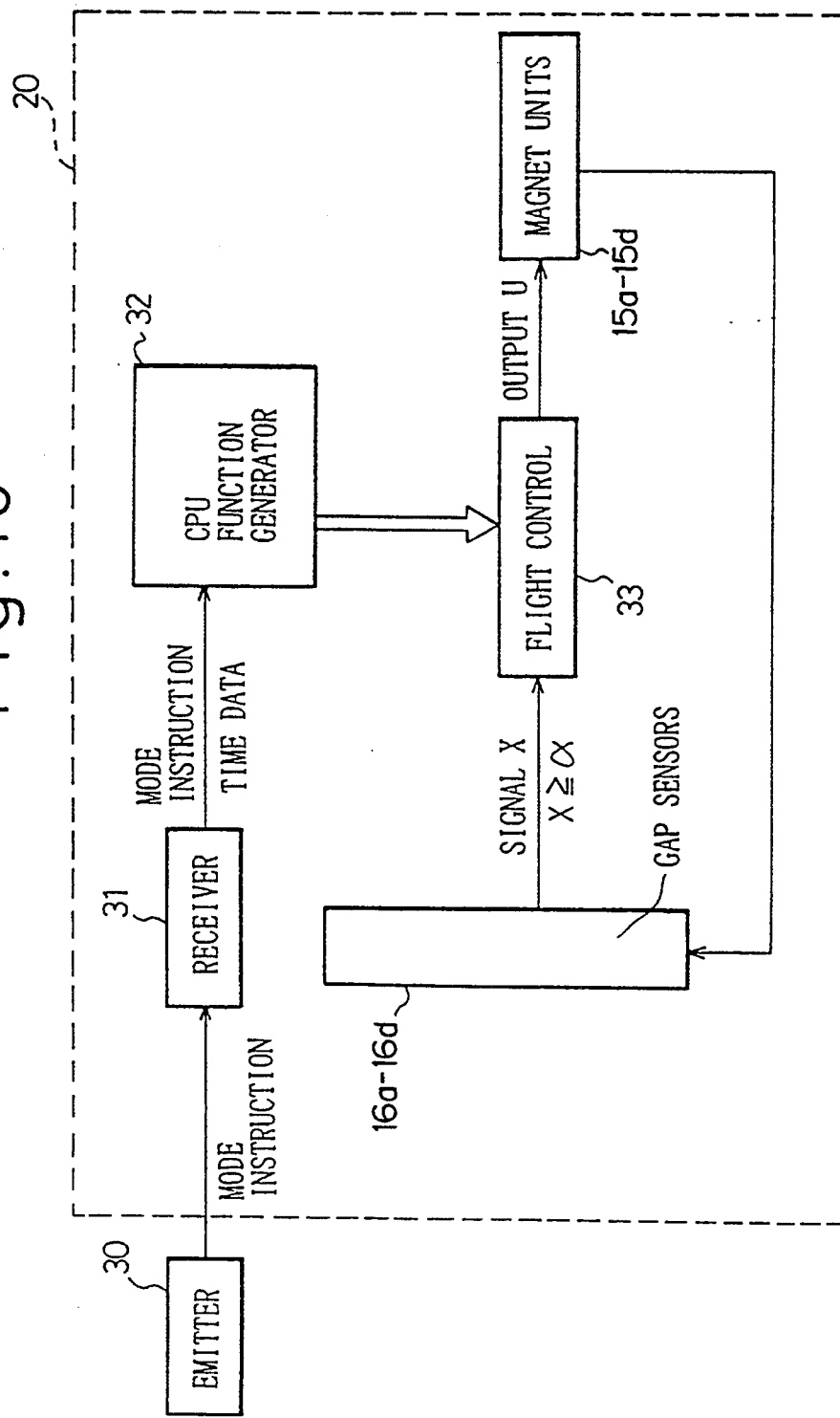
FIG. 10 is a block diagram of the control means of the magnetic levitating transportation apparatus of FIG. 1.

Further, as shown in FIG. 2, the vehicle 12 includes an electric battery 19 for actuating the electro-magnets 14 of the magnet units 15a to 15d and a control means (reference numeral 20 in FIG. 10). The vehicle 12 further includes a support means 22 for supporting a wafer 21.

As shown in FIG. 1, the quadrilateral formed by four magnet units 15a to 15d (the units 18a to 18d) is a non-parallel quadrilateral; i.e., the quadrilateral has first and second pairs of opposite sides, opposite sides of each pair being not parallel to each other. In addition, opposite sides of each pair are symmetrical with respect to one of the longitudinal and transverse center lines of the vehicle 12. That is, a line interconnecting the centers of adjacent two of the magnet units 15a to 15d is not parallel to the one of the travelling direction P or the transverse center line of the vehicle 12, and forms a certain angle therewith so that opposite lines are symmetrical. In addition, the width of the magnet units 15a to 15d is smaller than the width of the rails 11a and 11b, and the inner ends of two magnet units 15a and 15b located at the front of the vehicle 12, viewed in the travelling direction P, overlap the inner ends of the rails 11a and 11b, respectively, and the outer ends of two magnet units 15c and 15d located at the rear of the vehicle 12, viewed in the travelling direction P, overlap the outer ends of the rails 11a and 11b, respectively. Accordingly, in this arrangement, it is possible to ensure a self-centering action of the vehicle 12 relative to the rails 11a and 11b.

FIG. 10 is a block diagram of the control means 20 mounted on the vehicle 12. The control means 20 includes a receiver 31 for receiving signals from an emitter 30 arranged on the ceiling 10, and a central processing unit (CPU) including a function generator 32, and a flight control unit 33 connected to the function generator 32, and the gap sensors 16a to 16d and the magnet units 15a to 15d are connected to the flight control unit 33.

In the first embodiment, each of the gap sensors 16a to 16d together with the flight control unit 33 (or the CPU) has a function of first detecting means for detecting a flight gap G between the rails 11a and 11b and the vehicle 12 as well as a function of second detecting means for detecting a rail gap J between two rail elements 11e. Alternatively, it is possible to arrange the first and second detecting means separately.

The gap sensors 16a to 16d output signals X, respectively, and the flight control unit 33 compares each of the signals X with a predetermined value $\alpha$. If one of the signals X equals or is greater than a predetermined value $\alpha$ ($X \geq \alpha$), the flight control unit 33 judges that the second detecting means detects a rail gap J between two rail elements 11e. If any of the signals X is smaller than a predetermined value $\alpha$ ($X < \alpha$), the flight control unit 33 judges that the second detecting means does not detect a rail gap J between two rail elements 11e.

The flight control unit 33 normally delivers the output U to the magnet units 15a to 15d for controlling a current supplied to the respective magnet units 15a to 15d in response to the signals X of the respective gap sensors 16a to 16d and in accordance with the function of the function generator 32.

When it is judged that any of the signals X is smaller than a predetermined value $\alpha$ ($X < \alpha$), the flight control unit 33 enables the output of the first detecting means, i.e., controls a current supplied to the respective magnet units 15a to 15d in response to the signals X of the respective gap sensors 16a to 16d.

When it is judged that one of the signals X equals or is greater than a predetermined value $\alpha$ ($X \geq \alpha$), the flight control unit 33 disables the signal X from the gap sensor in question, and stops the supply of the current to the associated magnet unit. The remaining magnet units are supplied with a current in response to signals X of the corresponding gap sensors.

Figure 11:
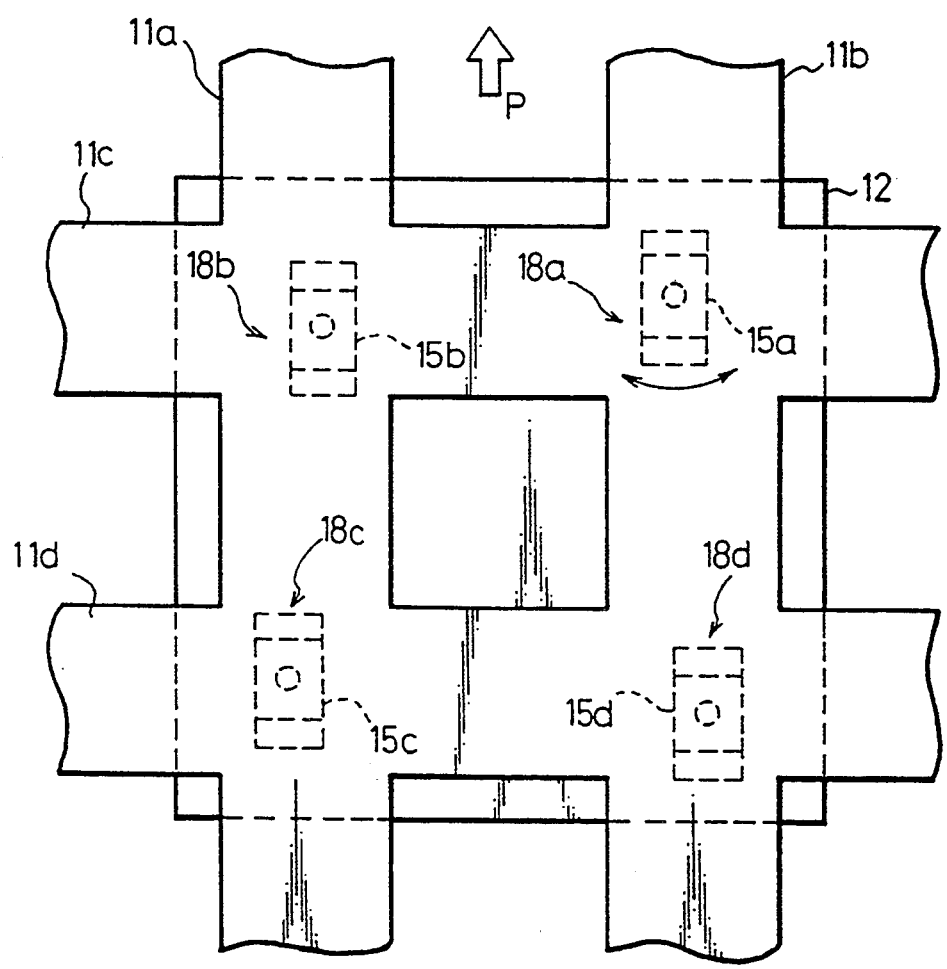
FIG. 11 is a view illustrating the magnetic levitating transportation apparatus of FIG. 1 used with crossing rails.
Figure 12:
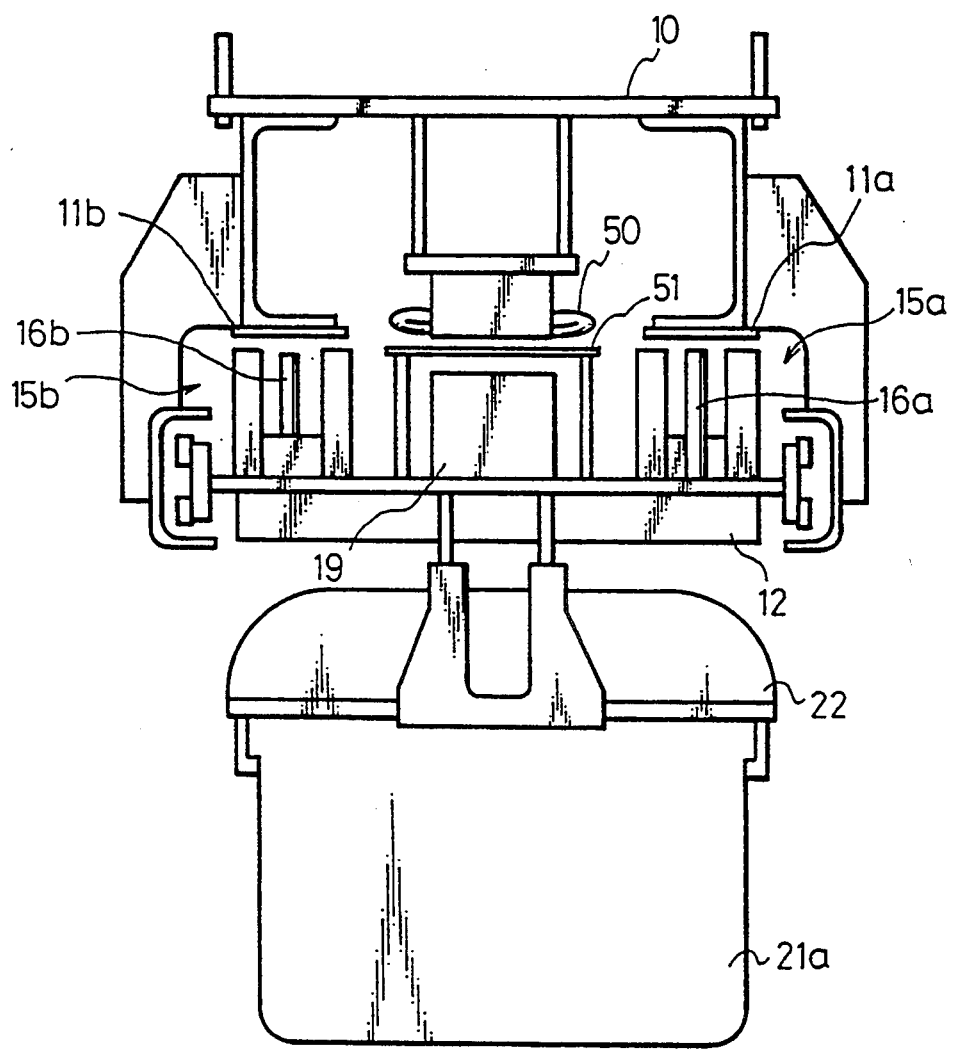
FIG. 12 is a front view of a magnetic levitating transportation apparatus according to the second embodiment of the present invention.

FIG. 11 shows the magnetic levitating transportation apparatus of the above described embodiment used with crossing rails including a first rail portion 11a and 11b and a second rail portion 11c and 11d. When the vehicle 12 is travelled along the first rail portion 11a and 11b, the motor 17 is activated to rotate the units 18a to 18d (the magnet units 15a to 15d) so that the direction of the magnetic flux generated by the magnet units 15a to 15d are perpendicular to the travelling direction P of the vehicle 12.

This condition is shown in FIG. 1. A current is then supplied to the magnet units 15a to 15d to cause the vehicle 12 to levitate relative to the first rail portion 11a and 11b. Then the vehicle 12 is caused to travel along the first rail portion 11a and 11b by the linear motor 50 and 51.

When the vehicle 12 approaches the rail gap J, as shown in FIG. 8, the leading magnet unit 15a among four magnet units 15a to 15d located on the non-parallel quadrilateral first passes the rail gap J. Therefore, the second detecting means constructed by the gap sensor 16a belonging to the magnet unit 15a detects the rail gap J, and the flight control unit 33 of the control means 20 instantaneously disables the output from the gap sensor 16a and stops the supply of the current to the associated magnet unit 15a.

The electro-magnets 14 of the leading magnet unit 15a are thus not supplied with the current and the leading magnet unit 15a is in an unpowered condition. The remaining three magnet units 15b to 15d are controlled to maintain adequate flight gaps G in response to the outputs of the respective gap sensors 16b to 16d. Accordingly, the vehicle 12 can travel maintaining a normal horizontal posture and the battery 19 does not supply an excessive current.

Thereafter, the gap sensor 16a will again detect the flight gap G and starts the control of the current supplied to the leading magnet unit 15a after the leading magnet unit 15a passes through the rail gap J. Then the second leading magnet unit 15b will reach the rail gap J, and the current supplied to the second leading magnet unit 15b will be switched in a similar manner to the leading magnet unit 15a. In this way, the magnet units 15a to 15d can sequentially pass the rail gap J since four magnet units 15a to 15d are located on a non-parallel quadrilateral.

When the vehicle 12 is transferred from the first rail portion 11a and 11b to the second rail portion 11c and 11d, the motor 17 is activated to rotate the units 18a to 18d (the magnet units 15a to 15d) by 90 degrees so that the direction of the magnetic flux generated by the magnet units 15a to 15d are perpendicular to the travelling direction of the vehicle 12, as shown in FIG. 11. Therefore, the angular position of the vehicle 12 is maintained unchanged and only the direction of the magnet units 15a to 15d is adapted to the second rail portion 11c and 11d. In this case, the relationship between the magnet units 15a to 15d and the second rail portion 11c and 11d is identical to the above described relationship between the magnet units 15a to 15d and the first rail portion 11a and 11b, to effect the self-centering action.

FIGS. 12 to 22 shows a magnetic levitating transportation apparatus according to the second embodiment of the present invention. The magnetic levitating transportation apparatus of FIGS. 12 and 13 comprises, similarly to the previous embodiment, two parallel rails 11a and 11b, a vehicle 12 capable of travelling along the rails 11a and 11b, a linear motor including a primary winding 50 and a secondary conductor plate 51, and four magnet units 15a to 15d for causing the vehicle 12 to magnetically levitate relative to the rails 11a and 11b. Each of the magnet units 15a to 15d, similarly to the previous embodiment, comprises a central permanent magnet 13 and two electro-magnets 14 on either side of the electro-magnet 13. Also, the vehicle 12 includes an electric battery 19 for actuating the electro-magnets 14 of the magnet units 15a to 15d, a control means 20, and a support means 22 for supporting a cassette 21a accommodating wafers.

Gap sensors 16a to 16d are arranged in association with the magnet units 15a to 15d, respectively, and rail gap sensors 56a to 56d, which are constructed separately from the gap sensors 16a to 16d, are also arranged in association with the magnet units 15a to 15d. Accordingly, four sets of the gap sensors 16a to 16d and the rail gap sensors 56a to 56d are arranged on or near the magnet units 15a to 15d, respectively. In this embodiment, the gap sensors 16a to 16d act as a first detecting means, and the rail gap sensors 56a to 56d act as a second detecting means.

Figure 13:
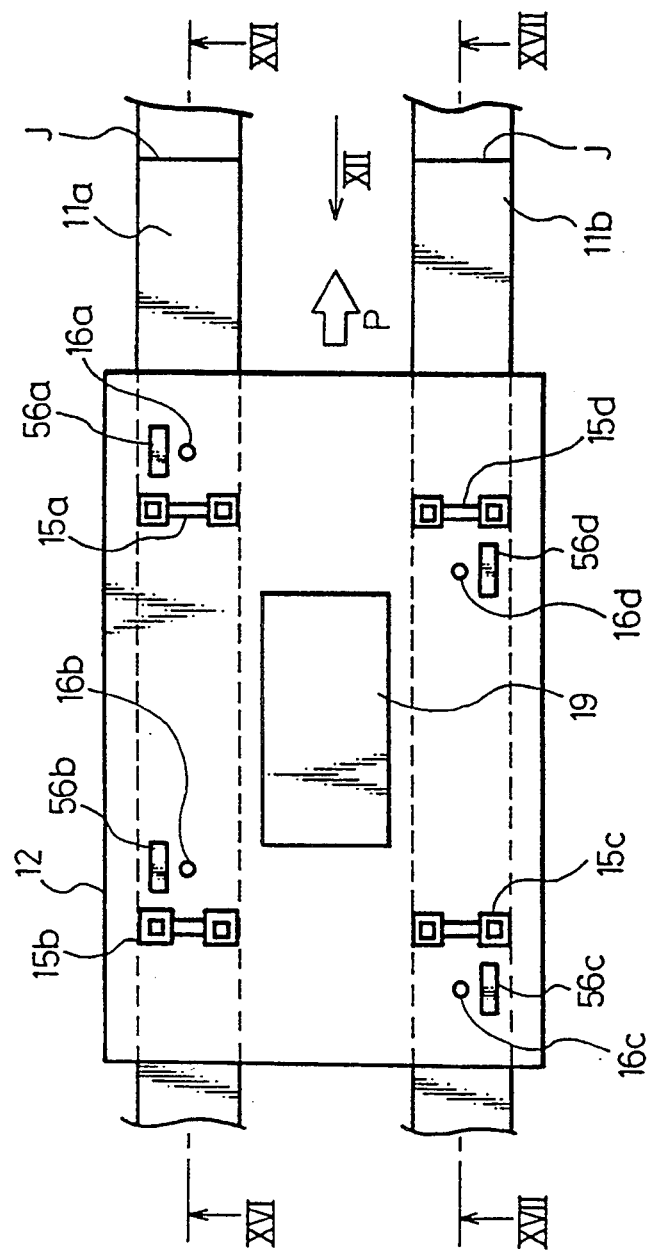
FIG. 13 is a plan view of the apparatus of FIG. 12.
Figure 14:
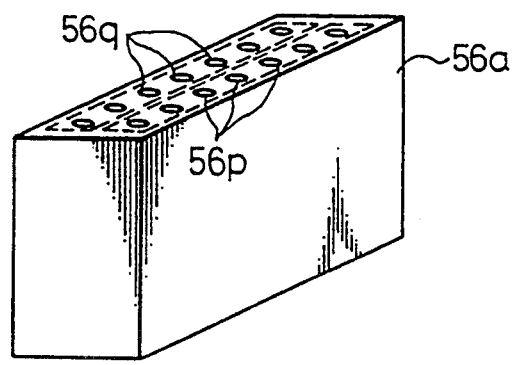
FIG. 14 is a perspective view of the rail gap sensor of FIG. 12.

As shown in FIG. 13, the rail gap sensors 56a to 56d have a greater length along the longitudinal center line of the vehicle 12 than that of the gap sensors 16a to 16d. Gap sensors 16a to 16d have a similar arrangement to those described above. The rail gap sensors 56a to 56d have, for example, an arrangement, as shown in FIG. 14, in which each of the rail gap sensors 56a to 56d comprises a light emitting array 56p comprising a plurality of optical fibers and a light receiver array 56q comprising a plurality of optical fibers. The light emitting array 56p and the light receiver array 56q are connected to light emitters and light receivers, respectively, and thus it is possible to detect a rail gap J where the ends of two rail elements 14e abut by detecting light emitted from light emitters and reflected at the rails 11a and 11b.

In this embodiment, as shown in FIG. 13, four magnet units 15a to 15d form a quadrilateral, which has a first pair of opposite sides extending parallel to the longitudinal center line of the vehicle 12 and a second pair of opposite sides extending parallel to the transverse center line of the vehicle 12. The longitudinal center line of the vehicle 12 is parallel to the rails 11a and 11b, and the first pair of opposite sides of the quadrilateral comprises first and second opposite sides extending parallel to the longitudinal center line of the vehicle on either side of the longitudinal center line of the vehicle 12. The first side overlaps the rail 11a, and the second side overlaps the rail 11b, in FIG. 13.

Two of the gap sensors 16a and 16b and the rail gap sensors 56a and 56b are located on the first side and in front of the associated magnet units 15a and 15b when viewed in the travelling direction P, Further two of the gap sensors 16c and 16d and the rail gap sensors 56c and 56d are located on the second side and behind the associated magnet units 15c and 15d when viewed in the travelling direction P.

In addition, four of the gap sensors 16a to 16d and the rail gap sensors 56a to 56d are located on a line parallel to the transverse center line of the vehicle 12, respectively. Each of the rail gap sensors 56a to 56d has a greater length along the longitudinal center line of the vehicle 12 than that of each of the gap sensors 16a to 16d, and each of the gap sensors 16a to 16d is located at a position corresponding substantially to the center of each of the rail gap sensors 56a to 56d.

In the present invention, it is considered that four gap sensors 16a to 16d are in a common plane, if the vehicle 12 is sufficiently rigid. Using this principle, it is possible to calculate one unknown flight gap G from three known flight gap G, by expressing the three dimensional positions of the gap sensors 16a to 16d as (X, Y, Z). In the preferred embodiment described below, such calculation is carried out regarding four gap sensors 16a to 16d, and then the exact flight gaps G of the magnet units 15a to 15d are calculated.

Figure 15:
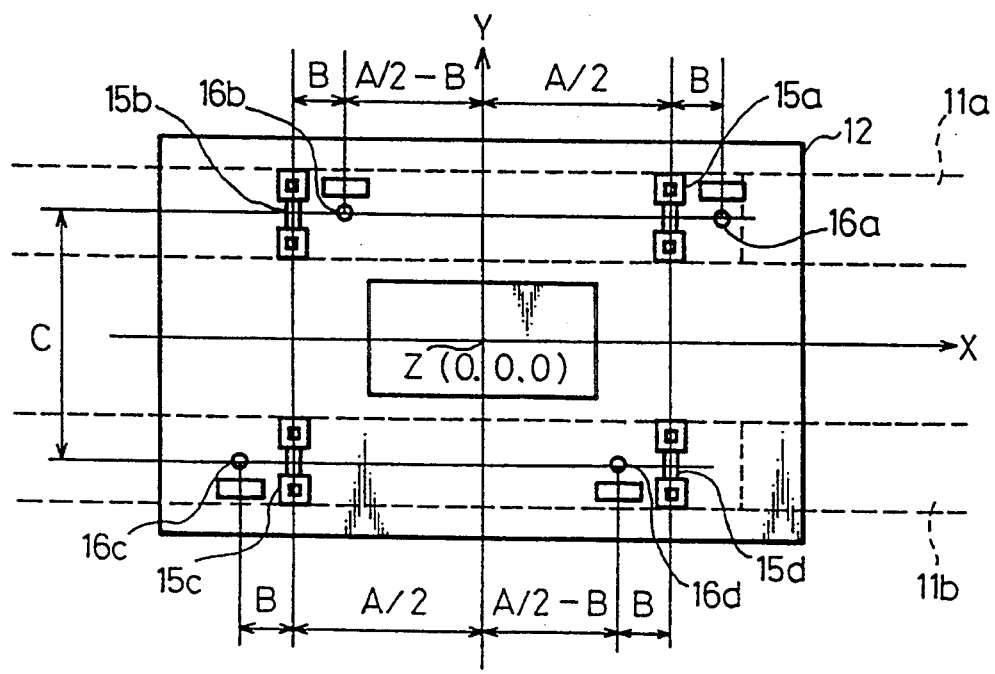
FIG. 15 is a view illustrating the geometry of the elements of the apparatus of FIGS. 12 and 13.

An equation of a plane is generally expressed by $(P_1X+P_2Y+P_3Z=P_4)$ where $P_1$, $P_2$, $P_3$ and $P_4$ are coefficients. Here, X-axis is taken along the longitudinal axis of the vehicle 12, Y-axis is taken along the transverse axis of the vehicle 12, and the origin of X-axis and Y-axis is the center of the magnet units 15a to 15d, as shown in FIG. 15. Z-axis is taken perpendicular to the rails 11a and 11b, and the origin of Z-axis is the lower surface of the rails 11a and 11b. The manner of calculation is described with reference to FIG. 22 later.

Figure 16:
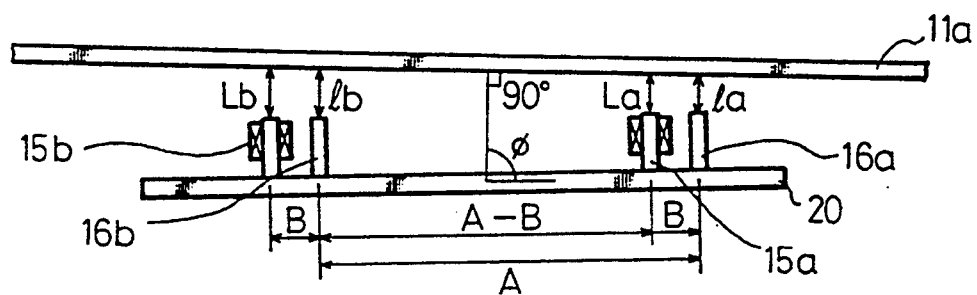
FIG. 16 is a cross-sectional view of the apparatus of FIGS. 12 and 13, taken along the line XVI—XVI of FIG. 13.
Figure 17:
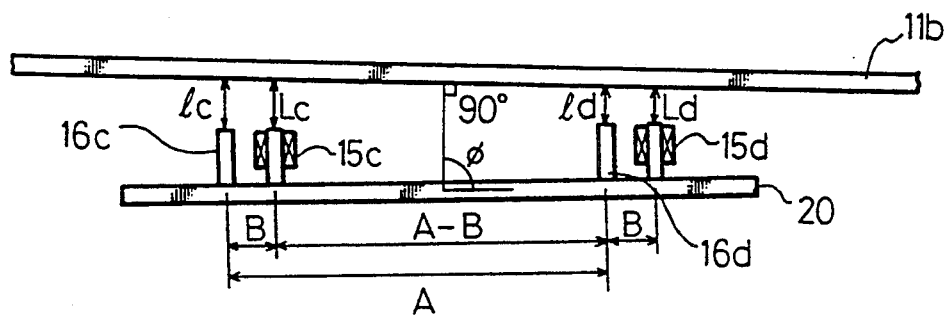
FIG. 17 is a cross-sectional view of the apparatus of FIGS. 12 and 13, taken along the line XVII—XVII of FIG. 13.

FIGS. 15 to 17 show the geometry of four sets of the magnet units 15a to 15d, gap sensors 16a to 16d, and rail gap sensors 56a to 56d.

The dimension A is the distance between two longitudinally spaced magnet units 15a and 15d (or 15b and 15c), the dimension B the distance between each of the magnet units 15a to 15d and each of the gap sensors 16a to 16d, and the dimension C is the distance between two transversely spaced magnet units 15a and 15b (or 15c and 15d).

The dimension $L_a$ to $L_d$ are the gaps or distances between the magnet units 15a and 15d and the rails 11a and 11b, and the dimension $l_a$ to $l_d$ are gaps or the distances between the gap sensors 16a and 16d and the rails 11a and 11b, respectively. The vehicle 12 may tilt relative to the rails 11a and 11b, and forms an angle $\phi$ with a line perpendicular to the rails 11a and 11b.

With reference to FIGS. 16 and 17, the following relationships exist from the principle of a triangle:

$$L_a = l_a - B(l_a - l_b)/A$$

$$L_b = l_b - B(l_a - l_b)/A$$

$$L_c = l_c - B(l_c - l_d)/A$$

$$L_d = l_d - B(l_c - l_d)/A$$

This means that if the gap sensors 16a and 16d are shifted from the magnet units 15a and 15d, it is possible to obtain exact positions of the magnet units 15a and 15d from the above relationship.

Figure 20:
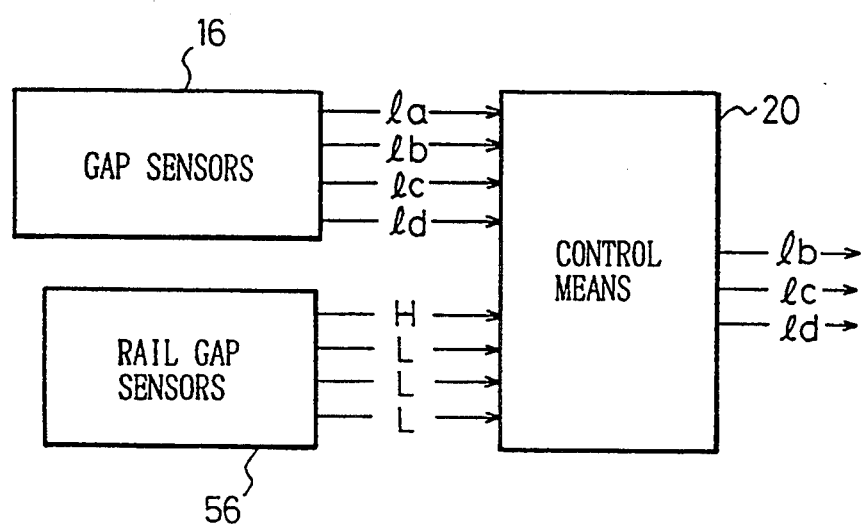
FIG. 20 is a block diagram of a portion of the control means of the magnetic levitating transportation apparatus of FIG. 12.
Figure 21:
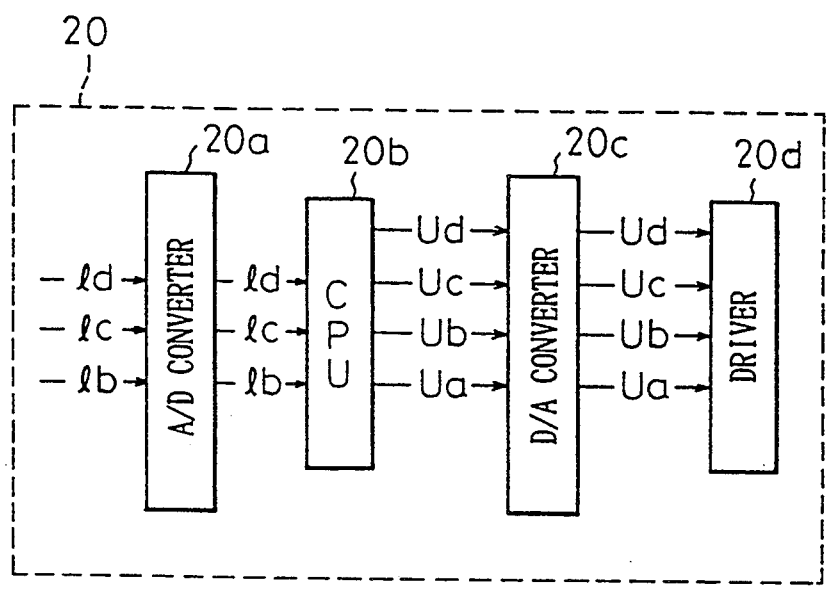
FIG. 21 is a block diagram of the remaining portion of the control means of the magnetic levitating transportation apparatus of FIG. 12.

FIG. 20 shows a portion of the control means 20, and FIG. 21 shows the remaining portion of the control means 20.

FIG. 20 shows that the outputs $l_a$ to $l_d$ of the gap sensor 16a to 16d, and the outputs H and L of the rail gap sensor 56a to 56d are input to the control means 20. The outputs $l_a$ to $l_d$ of the gap sensor 16a to 16d are analogue values which are proportional to the flight gaps G.

Figure 18:
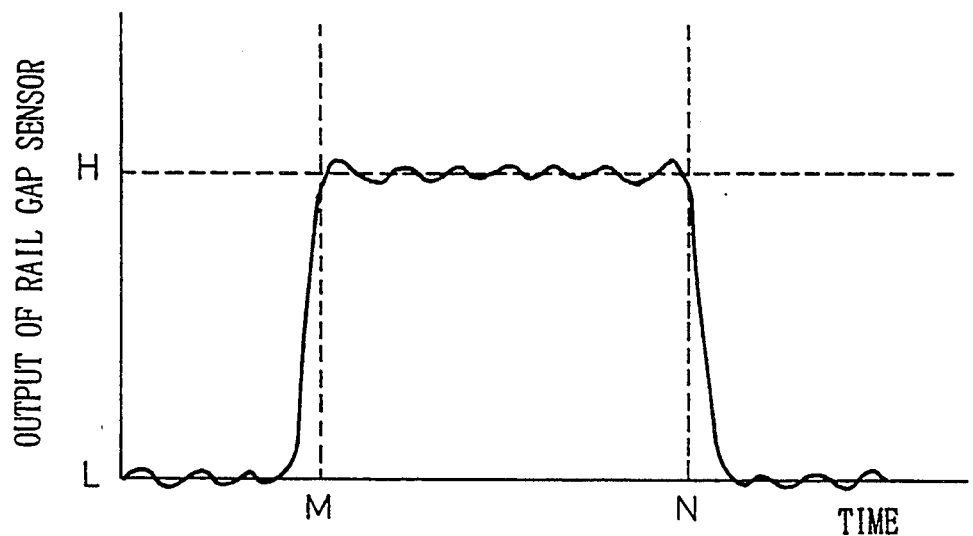
FIG. 18 is a view illustrating an output of the rail gap sensor of FIG. 12.
Figure 19A:
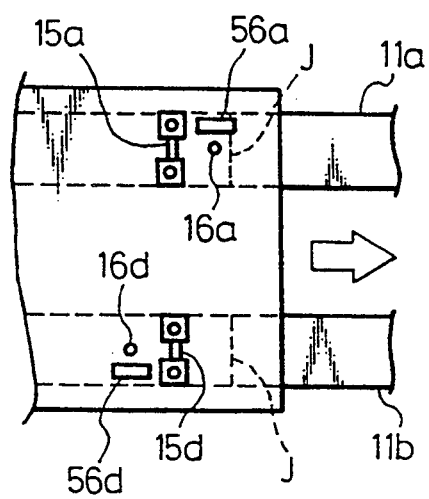
FIG. 19A is a view illustrating an instant that the leading edge of one of the rail gap sensors approaches a rail gap.
Figure 19B:
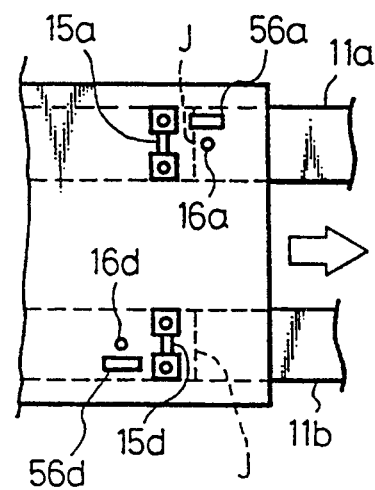
FIG. 19B is a view illustrating an instant that the trailing edge of the rail gap sensor of FIG. 19A passes the rail gap.

FIG. 18 shows an example of the output of the rail gap sensors 56a to 56d. The output of the rail gap sensors 56a to 56d is normally L. The output of the rail gap sensors 56a to 56d becomes H between the points M and N in FIG. 18. The point M in FIG. 18 corresponds to the instance of FIG. 19A in which the leading edge of the rail gap sensor 56a reaches the rail gap J of the rails 11a and 11b, and the point N in FIG. 18 corresponds to the instance of FIG. 19B in which the trailing edge of the rail gap sensor 56a passes the rail gap J of the rails 11a and 11b. This is applied to the other rail gap sensors 56b to 56d.

FIG. 20 shows that the output of the rail gap sensor 56a is H and the outputs of the other rail gap sensors 56b to 56d are L. It will be understood that the outputs of the other rail gap sensors 56b to 56d may become H.

When the output of one rail gap sensor 56a becomes H, the control means 20 disables the output $l_a$ of the gap sensor 16a associated to that rail gap sensor 56a, and proceeds only the outputs $l_b$ to $l_d$ of the other rail gap sensors 56b to 56d to the next step.

In FIG. 21, the control means 20 includes an A/D converter 20a, a CPU 20b, a D/A converter 20c, and a driver 20d. The outputs $l_b$ to $l_d$ from the portion of the control means 20 of FIG. 20 are input to the A/D converter 20a which output the digital conversion of the data $l_b$ to $l_d$ to the CPU 20b. The CPU 20b calculates the current $U_b$ to $U_d$ to be supplied to the magnet units 15b to 15d in response to the data $l_b$ to $l_d$, and changes the flight gap G between the gap sensor 16a passing through the rail gap L and the rails 11a and 11b from three data $l_b$ to $l_d$, and calculates the current $U_a$ to be supplied to the magnet unit 15a. The driver 20d supplies the current $U_a$ to $U_d$ to the magnet units 15a to 15d.

FIG. 22 shows a flow chart of the control carried out by the CPU 20b. At step 60, the outputs $l_a$ to $l_d$ of the gap sensors 16a to 16d are input. At step 61, it is determined whether four data $l_a$ to $l_d$ exist or not. If the result is YES, it is judged that none of the rail gap sensor 56a to 56d detects the rail gap J and the program goes to step 65. If the result is NO at step 61, it is judged that one of the rail gap sensor 56a to 56d detects the rail gap J and the program goes to step 62. FIGS. 20 and 21 show this condition.

At step 62, three data $l_b$ to $l_d$ are substituted in the equation of the plane $P_1X+P_2Y+P_3Z=P_4$. Regarding the gap sensors 16b to 16d, the X-axis coordinate values and the Y-axis coordinate values are known from the relationship of FIG. 15, and the Z-axis coordinate values are $l_b$ to $l_d$. Accordingly, three equations can be set up for three gap sensors 16b to 16d. In this case, $P_1$, $P_2$, $P_3$ and $P_4$ are unknown quantities. When four unknown quantities are to be calculated from three equations, three of four unknown quantities $P_1$, $P_2$, $P_3$ and $P_4$ can be obtained as a function of one of the four unknown quantities $P_1$, $P_2$, $P_3$ and $P_4$; $P_2=f_1(P_1)$, $P_3=f_1(P_1)$, and $P_4=f_1(P_1)$, as shown at step 63.

Accordingly, at step 64, it is possible to solve the Z-axis coordinate value, or the flight gap G of the gap sensor 16a, by substituting $P_1$, $P_2$, $P_3$ and $P_4$ and X-axis and Y-axis coordinate values of the gap sensor 16a to the equation of the plane $P_1X+P_2Y+P_3Z=P_4$. The result is stored as $l_a$.

Then the program goes from step 64 and also from step 61 to step 65, and the gaps $L_a$ to $L_d$ between the magnet units 15a and 15d and the rails 11a and 11b are calculated from the gaps $l_a$ to $l_d$ in accordance with the above described relationship. Then the program goes to step 66, and the current $U_a$ to $U_d$ to be supplied to the magnet units 15a to 15d is calculated.

We claim:

1. A magnetic levitating transportation apparatus for a vehicle, comprising:
    a rail support system comprising first and second parallel rails, each rail comprising a plurality of successive rail elements arranged in an end-to-end abutting relationship and defining a respective rail-to-rail gap therebetween;
    four support assemblies connected to the vehicle and providing levitation support of the vehicle from the rail support system, first and second said support assemblies corresponding to and travelling along the first rail and third and fourth said support assemblies corresponding to and travelling along the second rail, each support assembly comprising:
    an electro-magnetic unit, coupled through a magnetic path to the corresponding rail, magnetically levitating and thereby supporting the vehicle, relative to the corresponding rail, by a magnetic support force in accordance with an energizing current supplied thereto, the level of the energizing current and the corresponding level of the magnetic support force being selectively adjustable and being selected so as to maintain a vehicle-to-rail gap of a desired size between the electro-magnetic unit and the corresponding rail, each rail-to-rail gap causing a discontinuity in the magnetic path and a corresponding reduction in the level of the magnetic support force and the desired size of the vehicle-to-rail gap for the selected level of energizing current,
    first detecting means for detecting variations in the size of the vehicle-to-rail gap, as produced by the associated electro-magnetic unit, and generating a corresponding first detection output, and
    second detecting means for detecting the presence and the absence of a rail-to-rail gap in the corresponding rail of the rail support system as the associated support assembly travels along the corresponding rail and for producing a corresponding second detection output; and
    means for supplying energizing current to the respective electro-magnetic units of the four support assemblies; and
    control means for adjusting, when a respective second detecting means detects the absence of a rail-to-rail gap, the level of the energizing current supplied to the associated electro-magnetic unit in accordance with the first detection output of the associated first detection means and thereby to maintain the desired size of the corresponding vehicle-to-rail gap and for adjusting, when a respective second detecting means detects the presence of a rail-to-rail gap, the level of the energizing current supplied to the associated electro-magnetic unit for the duration of the detection of the rail-to-rail gap by the associated second detecting means and thereby to compensate for the corresponding reduction in the level of the magnetic support force caused by the rail-to-rail gap;
    wherein the four support assemblies are connected to the vehicle so that the electro-magnetic units of the four support assemblies are arranged so as to define a quadrilateral having two pairs of opposite sides, the respective opposite sides of each pair being non-parallel.

2. An apparatus according to claim 1, wherein:
    the electro-magnet unit of each support assembly comprises an electro-magnet and a permanent magnet, and
    the means for supplying comprises a battery which is arranged on the vehicle and drives the electro-magnet of each support assembly.

3. An apparatus according to claim 1, wherein the electro-magnet unit of each support assembly comprises a central permanent magnet having two opposite sides and two electro-magnets, one said electro-magnet positioned on each of the opposite sides of the central permanent magnet, the central permanent magnet and two electro-magnets arranged in a U-shape.

4. An apparatus according to claim 1, wherein the second detection output of each second detecting means represents a specific value, the first detecting means and the second detecting means of each support assembly form a common gap sensor, and a respective second detecting means detects a rail-to-rail gap when the specific value represented by the second detection output of the respective second detecting means is greater than a predetermined value.

5. An apparatus according to claim 4, wherein the electro-magnetic unit of each support assembly has a corresponding center and the first detecting means of each support assembly is arranged on the center of the associated electro-magnetic unit, the respective electro-magnetic units being rotatable about the corresponding center so that the vehicle can travel along crossing rails by rotating the electro-magnetic units without rotating the vehicle.

6. An apparatus according to claim 5, wherein the vehicle travels in a travelling direction and each electro-magnetic unit has an angular position and generates a magnetic flux in a predetermined direction, the apparatus further comprising an actuator which controls the angular position of each electro-magnetic unit so that the direction of the magnetic flux generated by each electro-magnetic unit is perpendicular to the travelling direction of the vehicle.

7. An apparatus according to claim 6, wherein the vehicle defines a longitudinal center line and a transverse center line, and the quadrilateral defined by the four electro-magnetic units has first and second pairs of opposite sides, the respective, opposite sides of one pair being symmetrical with respect to the longitudinal center line and the respective, opposite sides of the other pair being symmetrical with respect to the transverse center line.

8. An apparatus according to claim 4, wherein, when a respective second detecting means detects the presence of a rail-to-rail gap, the control means stops the supply of energizing current to the associated electro-magnetic unit.

9. An apparatus according to claim 1, wherein said vehicle has a longitudinal and transverse center lines, and the quadrilateral formed by the four electro-magnet units has a first pair of opposite sides extending parallel to the longitudinal center line of the vehicle and a second pair of opposite sides extending parallel to the transverse center line of the vehicle.

10. An apparatus according to claim 9, wherein the longitudinal center line is parallel to the rails and the first pair of opposite sides of the quadrilateral formed by the four electro-magnet units comprises first and second opposite sides extending parallel to the longitudinal center line of the vehicle on either side of the longitudinal center line of the vehicle, two sets of said first and second detecting means being located on the first side and in front of the associated electro-magnet units when viewed in a predetermined travelling direction, and two further sets of said first and second detecting means being located on the second side and behind the associated electro-magnet units when viewed in the predetermined travelling direction.

11. An apparatus according to claim 10, wherein said first detecting means comprises a gap sensor, and said second detecting means comprises a rail gap sensor constructed separately from the gap sensor.

12. An apparatus according to claim 11, wherein at least one of the sets of first and second detecting means are located on a line parallel to the transverse center line of the vehicle.

13. An apparatus according to claim 12, wherein said second detecting means has a greater length along the longitudinal center line of the vehicle than that of the first detecting means.

14. An apparatus according to claim 13, wherein said first detecting means is located at a position corresponding to substantially the center of said second detecting means.

15. An apparatus according to claim 14, wherein while one of said second detecting means is detecting a rail gap, said control means disables the output of the first detecting means associated with said one second detecting means detecting a rail gap and revises a current supplied to the associated magnet unit from outputs of the remaining three first detecting means other than that associated with said one second detecting means detecting a rail gap.

16. An apparatus according to claim 15, wherein said first detecting means are in a common plane, and a gap to be detected by the first detecting means associated with said one second detecting means detecting a rail gap is revised from the three dimensional positions X, Y, Z, of said first detecting means and an equation of a plane $P_1X + P_2Y + P_3Z = P_4$, where $P_1$, $P_2$, $P_3$ and $P_4$ are coefficients.

17. A magnetic levitating transportation apparatus for a vehicle, comprising:

a rail support system comprising first and second parallel rails, each rail comprising a plurality of successive rail elements arranged in an end-to-end abutting relationship and defining a rail-to-rail gap therebetween;

four support assemblies connected to the vehicle and providing levitation support of the vehicle from the rail support system, first and second said support assemblies corresponding to and travelling along the first rail and third and fourth said support assemblies corresponding to and travelling along the second rail, each support assembly comprising:

an electro-magnetic unit, coupled through a magnetic path to the corresponding rail, magnetically levitating and thereby supporting the vehicle, relative to the corresponding rail, by a magnetic support force in accordance with an energizing current supplied thereto, the level of the energizing current and the corresponding level of the magnetic support force being selectively adjustable and being selected so as to maintain a vehicle-to-rail gap of a desired size between the electro-magnetic unit and the corresponding rail, each rail-to-rail gap causing a discontinuity in the magnetic path and a corresponding reduction in the level of the magnetic support force and the desired size of the vehicle-to-rail gap for the selected level of energizing current, the electro-magnetic unit having a center and rotatably constructed about the center so that the vehicle can travel along crossing rails by rotating the electro-magnetic unit without rotating the vehicle, a gap sensor which is positioned at the center of the associated electro-magnetic unit and comprises first detecting means for detecting variations in the size of the vehicle-to-rail gap, as produced by the associated electro-magnetic unit, and generating a corresponding first detection output, and second detecting means for detecting the presence and the absence of a rail-to-rail gap in the corresponding rail of the rail support system as the associated support assembly travels along the corresponding rail and for producing a corresponding second detection output, the second detection output indicating the presence of a rail-to-rail gap when the second detection output is above a predetermined level; and means for supplying energizing current to the respective electro-magnetic units of the four support assemblies; and control means for adjusting, when a respective second detecting means detects the absence of a rail-to-rail gap, the level of the energizing current supplied to the associated electro-magnetic unit in accordance with the first detection output of the associated first detection means and thereby to maintain the desired size of the corresponding vehicle-to-rail gap and for adjusting, when a respective second detecting means detects the presence of a rail-to-rail gap, the level of the energizing current supplied to the associated electro-magnetic unit for the duration of the detection of the rail-to-rail gap by the associated second detecting means and thereby to compensate for the corresponding reduction in the level of the magnetic support force caused by the rail-to-rail gap;

wherein the four support assemblies are connected to the vehicle so that the electro-magnetic units of the four support assemblies are arranged so as to define a quadrilateral having two pairs of opposite sides, the respective opposite sides of each pair being non-parallel.

18. An apparatus according to claim 17, wherein the vehicle travels in a travelling direction and each electro-magnetic unit has an angular position and generates a magnetic flux in a predetermined direction, the apparatus further comprising an actuator which controls the angular position of each electro-magnetic unit so that the direction of the magnetic flux generated by each electro-magnetic unit is perpendicular to the travelling direction of the vehicle.

19. An apparatus according to claim 18, wherein the vehicle defines a longitudinal center line and a transverse center line, the respective, opposite sides of one pair of opposite sides of the quadrilateral defined by the electro-magnetic units being symmetrical with respect to the longitudinal center line and the respective, opposite sides of the other pair of opposite sides being symmetrical with respect to the transverse center line.

20. An apparatus according to claim 19, wherein the control means stops the electro-magnetic unit of a respective support assembly from receiving an energizing current when the second detecting means of the respective support assembly detects a rail-to-rail gap.

21. A magnetic levitating transportation apparatus for a vehicle, comprising:

a rail support system comprising first and second parallel rails, each rail comprising a plurality of successive rail elements arranged in an end-to-end abutting relationship and defining a rail-to-rail gap therebetween;

four support assemblies connected to the vehicle and providing levitation support of the vehicle from the rail, first and second said support assemblies corresponding to and travelling along the first rail and third and fourth said support assemblies corresponding to and travelling along the second rail, each support assembly comprising:

an electro-magnetic unit, coupled through a magnetic path to the corresponding rail, magnetically levitating and thereby supporting the vehicle, relative to the corresponding rail, by a magnetic support force in accordance with an energizing current supplied thereto, the level of the energizing current and the corresponding level of the magnetic support force being selectively adjustable and being selected so as to maintain a vehicle-to-rail gap of a desired size between the electro-magnetic unit and the corresponding rail, each rail-to-rail gap causing a discontinuity in the magnetic path and a corresponding reduction in the level of the magnetic support force and the desired size of the vehicle-to-rail gap for the selected level of energizing current, and gap detecting means for detecting the respective rail-to-rail gaps in the corresponding rail of the rail support system as the associated support assembly travels along the corresponding rail and for producing a corresponding output; and means for supplying energizing current to the respective electro-magnetic units of the four support assemblies; and control means for adjusting the level of the energizing current supplied to each electro-magnetic unit in accordance with the output of the gap detecting means, wherein the four support assemblies are connected to the vehicle so that the electro-magnetic units of the four support assemblies are arranged so as to define a quadrilateral having two pairs of opposite sides, the respective opposite sides of each pair being non-parallel.

* * * * *

UNITED STATES PATENT AND TRADEMARK OFFICE
CERTIFICATE OF CORRECTION

PATENT NO. : 5,377,596
DATED : January 3, 1995
INVENTOR(S) : Yoshinobu ONO et al.

It is certified that error appears in the above-indentified patent and that said Letters Patent is hereby corrected as shown below:

Columns 12 and 13, amend Claims 9, 10, 11, 12, 13, 14, 15 and 16, as shown:

9. An apparatus according to claim 1, wherein [said] the vehicle [has] defines a longitudinal center line and a transverse center [lines] line, and the quadrilateral [formed] defined by the four [electro-magnet] electro-magnetic units has a first pair of opposite sides extending parallel to the longitudinal center line [of the vehicle] and a second pair of opposite sides extending parallel to the transverse center line [of the vehicle].

10. An apparatus according to claim 9, wherein the longitudinal center line is parallel to the rails, and the first pair of opposite sides of the quadrilateral [formed] defined by the four [electro-magnet] electro-magnetic units comprises opposite, first and second [opposite] sides extending parallel to the longitudinal center line [of the vehicle] and on [either side] opposite sides, respectively, of the longitudinal center line [of the vehicle], two [sets] support assemblies of said [first and second detecting means] four support assemblies being located on the first side of the pair of opposite sides and in front of the respective, associated [electro-magnet] electro-magnetic units when viewed in a predetermined travelling direction, and two further [sets] support assemblies of said [first and second detecting means] four support assemblies being located on the second side of the pair of opposite sides and behind the respective, associated [electro-magnet] electro-magnetic units when viewed in the predetermined travelling direction.

UNITED STATES PATENT AND TRADEMARK OFFICE
CERTIFICATE OF CORRECTION

PATENT NO. : 5,377,596

DATED : January 3, 1995

INVENTOR(S) : Yoshinobu ONO et al.

Page 2 of 3

It is certified that error appears in the above-indentified patent and that said Letters Patent is hereby corrected as shown below:

11. An apparatus according to claim 10, wherein said first detecting means <u>of each support assembly</u> comprises a gap sensor, and said second detecting means <u>of each support assembly</u> comprises a rail gap sensor <u>which is</u> constructed separately from the gap sensor.

12. An apparatus according to claim 11, wherein at least one of the [sets of first and second detecting means are] <u>four support assemblies is</u> located on a line parallel to the transverse center line [of] <u>defined by</u> the vehicle.

13. An apparatus according to claim 12, wherein said second detecting means <u>of each support assembly</u> has a greater length along the longitudinal center line of the vehicle than that of the <u>associated</u> first detecting means.

14. An apparatus according to claim 13, wherein said first detecting means <u>of each support assembly</u> is located at a position corresponding to substantially the center of [said] <u>the associated</u> second detecting means.

UNITED STATES PATENT AND TRADEMARK OFFICE
CERTIFICATE OF CORRECTION

PATENT NO. : 5,377,596
DATED : January 3, 1995
INVENTOR(S) : Yoshinobu ONO et al.

It is certified that error appears in the above-indentified patent and that said Letters Patent is hereby corrected as shown below:

15. An apparatus according to claim 14, wherein while one of said second detecting means is detecting a rail gap, said control means disables the output of the first detecting means associated with [said one] <u>the respective</u> second detecting means detecting a rail gap and revises a current supplied to the associated magnet unit from outputs of the remaining [three] first detecting means [other than that associated with said one second detecting means detecting a rail gap].

16. An apparatus according to claim 15, wherein said first detecting means <u>of each support assembly</u> are in a common plane, and a gap to be detected by [the] <u>a respective</u> first detecting means associated with [said one] <u>a respective</u> second detecting means detecting a rail gap is revised from the three dimensional positions X, Y, Z, of [said] <u>the respective</u> first detecting means and an equation of a plane $P_1X + P_2Y + P_3Z = P_4$, wherein $P_1$, $P_2$ $P_3$ and $P_4$ are coefficients.

Signed and Sealed this

Second Day of July, 1996

Attest:

Attesting Officer

BRUCE LEHMAN

Commissioner of Patents and Trademarks